United States Patent [19]
Eslamy et al.

[11] Patent Number: 6,130,113
[45] Date of Patent: Oct. 10, 2000

[54] ENHANCED LAMINATION PROCESS BETWEEN HEATSPREADER TO PRESSURE SENSITIVE ADHESIVE (PSA) INTERFACE AS A STEP IN THE SEMICONDUCTOR ASSEMBLY PROCESS

[75] Inventors: Mohammad Eslamy, San Jose; Larry L. Jacobsen, Scotts Valley, both of Calif.

[73] Assignee: LSI Logic Corporation, Milpitas, Calif.

[21] Appl. No.: 09/114,345

[22] Filed: Jul. 13, 1998

[51] Int. Cl.[7] .......................... H01L 21/44; H01L 21/48; H01L 21/50
[52] U.S. Cl. .......................... 438/122; 438/118; 156/382
[58] Field of Search ..................... 438/112, 113, 438/121, 106; 29/840, 832, 829, 825; 156/381, 382

[56] References Cited

U.S. PATENT DOCUMENTS

| | | | |
|---|---|---|---|
| 5,147,821 | 9/1992 | McShane et al. | 438/118 |
| 5,203,076 | 4/1993 | Banerji et al. | 29/840 |
| 5,359,768 | 11/1994 | Haley | 29/840 |
| 5,533,256 | 7/1996 | Call et al. | 29/840 |
| 5,834,339 | 3/1996 | Distefano et al. | 438/125 |
| 5,895,972 | 12/1996 | Paniccia | 257/706 |
| 5,996,215 | 12/1999 | Yamazoe et al. | 29/622 |

*Primary Examiner*—Richard Elms
*Assistant Examiner*—Christian D. Wilson
*Attorney, Agent, or Firm*—Fitch, Even, Tabin & Flannery

[57] ABSTRACT

An apparatus and method of making a void free interface between a heatspreader and pressure sensitive adhesive (PSA) by attaching them in an air free environment. The PSA is placed on a pedestal in a vacuum chamber assembly, then the heatspreader is placed on top of the PSA and the chamber is closed. The air is removed by a vacuum means, creating an air free environment. Once the desired vacuum is obtained and the air is removed, pressure is applied to the heatspreader and PSA, joining them together with a void free interface between them. After joining, the vacuum is released and the vacuum chamber assembly is opened so that the heatspreader with PSA attached can be removed. The heatspreader with PSA is now ready for use with a semiconductor package. Additionally, the heatspreader with PSA may be joined to the integrated circuit die of a semiconductor package in an air free environment by the same process (using vacuum and pressure) as describe above.

9 Claims, 3 Drawing Sheets

ENHANCED LAMINATION PROCESS BETWEEN HEATSPREADER TO PRESSURE SENSITIVE ADHESIVE (PSA) INTERFACE AS A STEP IN THE SEMICONDUCTOR ASSEMBLY PROCESS

BACKGROUND OF THE INVENTION

The present invention relates to heatpsreaders having pressure sensitive adhesive, and more particularly an improved/enhanced lamination process between the heatspreader and pressure sensitive adhesive resulting in a void free interface.

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before.

The amount of heat generated by an integrated circuit (IC) die is related to the number of transistors on the IC die and the clock speeds at which they operate. The faster the transistors on the IC die are operated, the more heat is generated. Since advances in IC fabrication technology continue to make possible both increased transistor density and higher clock speeds, the problem of heat generation is becoming increasingly severe, particularly in high performance IC dies, which push the limits of fabrication technology.

As an increasing amount of heat is generated by the IC dies, the junction temperatures of the transistors in the device increases proportionately. The failure of the semiconductor device is directly related to the junction temperature at which it is operated. The higher the junction temperature, the higher the failure rate. A very significant limitation of the operation and reliability of the IC package is the efficient extraction of the generated heat from the IC die.

It is generally known to provide a heatspreader or a heat sink for an IC die in order to transfer the generated heat away from the IC die itself and into the surrounding air, thus reducing the junction temperature. The heatspreader is generally located as physically close to the IC die as possible in order to maximize the amount of heat transferred. Heatspreaders typically are constructed from a high thermal conductivity material and are designed to present a maximum amount of surface area to the ambient air in order to allow the heat generated by the IC die to be removed, either by natural or forced convection.

As more and more transistors are fabricated on the IC die, the overall amount of heat generated is increased. By using a flip-chip package, the active surface of the IC die is flipped and the non-active surface of the IC die is available to provide a direct connection between the IC die and the heatspreader. The heatspreader is attached to the non-active surface of the IC die with an adhesive or epoxy. Although thermal performance is improved, this direct connection suffers from several disadvantages. The major concern is the debonding or delamination of the heatspreader and IC die at the interface.

FIGS. 1a, 1b and 1c show the present method of attaching a pressure sensitive adhesive (PSA) to the heatspreader. The PSA assembly consists of a PSA 10 with a polyester release liner 15 applied to each side (FIG. 1a). Prior to attachment to the heatspreader 25, one of the liners 15 is removed exposing the adhesive (FIG. 1b). The PSA 10 is then attached to the heatspreader 25 with finger pressure, to tack them together. The assembly is then transferred to a fixture 20 in a press, which may be pneumatic, to supply the joining force. Force is applied to the assembly by the press, in the direction of arrow 30, joining the heatspreader 25 and PSA 10, as shown in FIG. 1c.

After the joining process of the PSA 10 to the heatspreader 25, the interface between them contains trapped air bubbles and voids 35 that tend to prohibit good adhesive contact between the heatspreader 25 and PSA 10. To compensate for this, excessive force is often applied to the assembly in order to try to achieve good contact between the components, which may damage them. These voids and trapped air 35 are often the root cause of delamination between the heatspreader and the IC package during assembly and use. This is due to the fact that after the heatspreader 25 is attached to the IC die of a flip-chip package, the assembly is heated to elevated temperatures for solder ball attachment to a printed circuit board. The trapped air 35 at the interface between the heatspreader 25 and the PSA layer 10 will cause moisture to outgas at the elevated temperature during subsequent process steps and use. This outgassing may cause delamination at the adhesive interface 10 between the heatspreader 25 and the IC die (not shown). If the adhesive interface 10 does not delaminate, there is still a high probability that the package will fail post solder ball attachment due to warpage and heat generated during use.

As the semiconductor technology advances, the need for heat dissipation remains critical. Thus, the attachment of the heatspreader to the IC die becomes increasingly important to device performance. In view of the above, it is evident that what is needed is an improved technique and method of adhesive attachment to the heatspreader of the semiconductor package that decreases debonding and delamination resulting from air trapped in the adhesive layer interface.

SUMMARY OF THE INVENTION

The present invention addresses the above and other needs by providing a lamination process for an improved/enhanced interface between a pressure sensitive adhesive and a heatspreader that reduces or eliminates air bubbles or voids between them.

The attachment of the pressure sensitive adhesive (PSA) to the heatspreader is done inside a vacuum chamber. The vacuum chamber assembly is comprised of a top piece or lid assembly and a base assembly. The base assembly with a central cavity forming a vacuum chamber cavity in which the components are assembled while the lid assembly seals the vacuum chamber during component assembly. The lid assembly has a central opening with a rubber seal sealingly covering the opening. Blocks of aluminum, sized to fit the opening, are positioned above and below the rubber seal and can free float up and down with the rubber seal and apply pressure to the heatspreader inside of the vacuum chamber.

In use, the heatspreader and PSA are positioned on a pedestal inside the vacuum chamber and the lid assembly is put in place, sealing the vacuum chamber. Air is removed from the vacuum chamber by a vacuum. Once the desired vacuum has been achieved in the vacuum chamber, pressure is then applied to the PSA and heatspreader by a press. The heatspreader and PSA are joined in an air free environment, resulting in a void free lamination interface between them. Optionally this same vacuum lamination process may be used to attach the heatspreader with PSA to the IC die for a void free interface.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
|---|---|
| 10 | Pressure Sensitive Adhesive |
| 15 | Polyester Release Liner |
| 20 | Fixture |
| 25 | Heatspreader |
| 30 | Pressure Arrow |
| 35 | Air Bubbles or Voids |
| 110 | Pressure Sensitive Adhesive |
| 115 | Polyester Release Liner |
| 125 | Heatspreader |
| 130 | Vacuum Chamber Assembly |
| 135 | Lid Assembly |
| 140 | Base Assembly |
| 141 | Base |
| 145 | Aluminum Housing |
| 150 | Gasket |
| 151 | Seal |
| 155 | Block |
| 156 | Rubber Pad |
| 160 | Air Evacuation Chamber |
| 165 | Vacuum Chamber |
| 170 | Vacuum Pad |
| 175 | Pedestal |
| 180 | Air Evacuation Dashed Arrows |
| 185 | Pressure Arrows |
| 190 | Flip-Chip with Heatspreader |
| 191 | Substrate |
| 192 | Printed Circuit Board |
| 193 | Solder Balls |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1A:
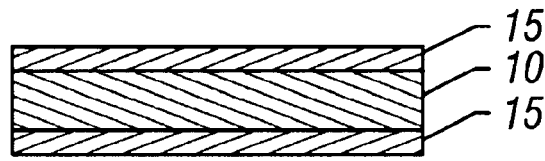
FIGS. 1a, 1b and 1c are cross-sectional views showing the current process of applying a pressure sensitive adhesive (PSA) to a heatspreader.
Figure 1B:
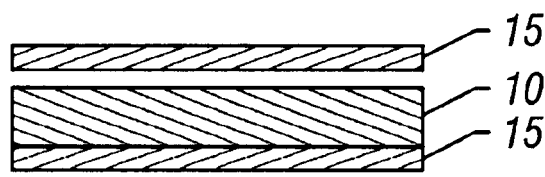
Figure 1C:
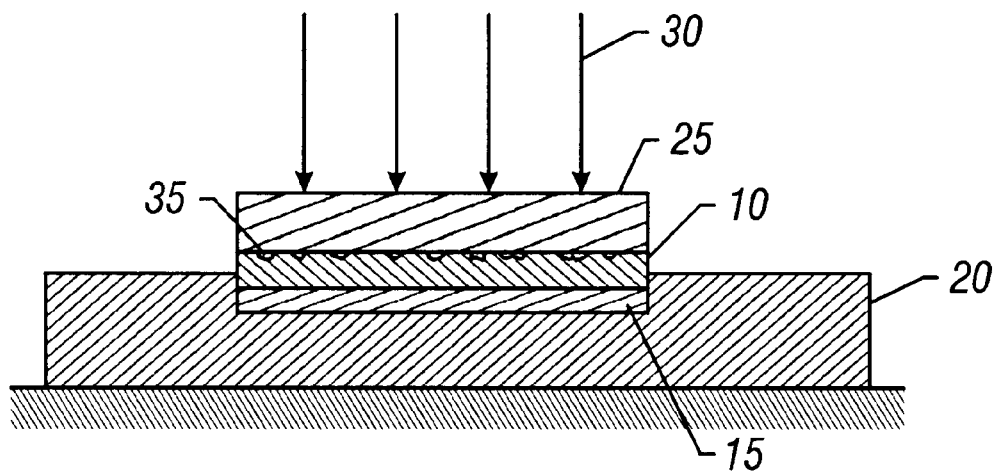

FIGS. 1a, 1b and 1c are cross-sectional views showing the current process of applying a pressure sensitive adhesive (PSA) to a heatspreader and is described in the Background of the Invention.

FIGS. 2a, 2b, 3 and 4 are cross-sectional views of an embodiment of the present invention showing a pressure sensitive adhesive (PSA) being applied to a heatspreader within a vacuum chamber achieving an improved/enhanced interface. Before the PSA is applied to the heatspreader, air is evacuated from the vacuum chamber. Once the air is removed, pressure is applied to the heatspreader and PSA, attaching them together, resulting in a void free lamination.

Figure 2A:
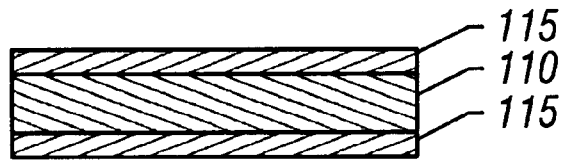
FIGS. 2a and 2b are cross-sectional views of the pressure sensitive adhesive (PSA) and release liner.
Figure 2B:
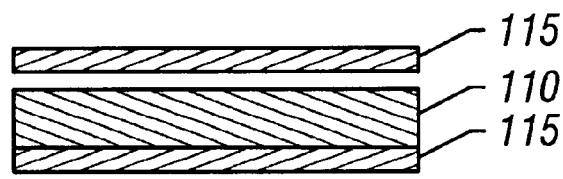

FIGS. 2a and 2b, show an adhesive or epoxy, such as a pressure sensitive adhesive (PSA) 110, that is used for attaching a heatspreader to an integrated circuit (IC) die. The PSA 110 is fabricated with release liners 115 applied to each side (as shown in FIG. 2a) for ease of handling prior to assembly. The release liners 115 are typically made from polyester. The PSA 110 may be trimmed or punched to the required size, and when ready for use, one of the polyester release liners 115 is removed. FIG. 2b shows the top polyester release liner 115 removed. The PSA assembly is now ready for attachment to a heatspreader 125.

Figure 3:
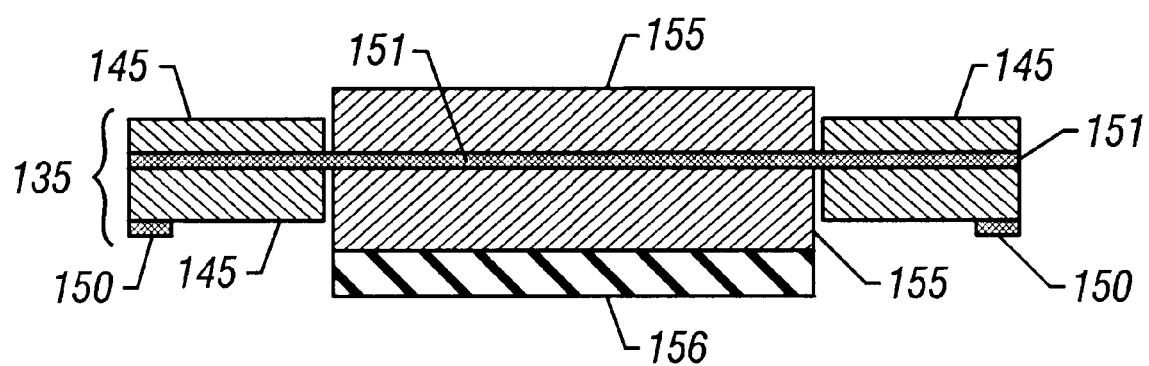
FIG. 3 is a cross-sectional view of the lid assembly of the vacuum chamber.
Figure 4:
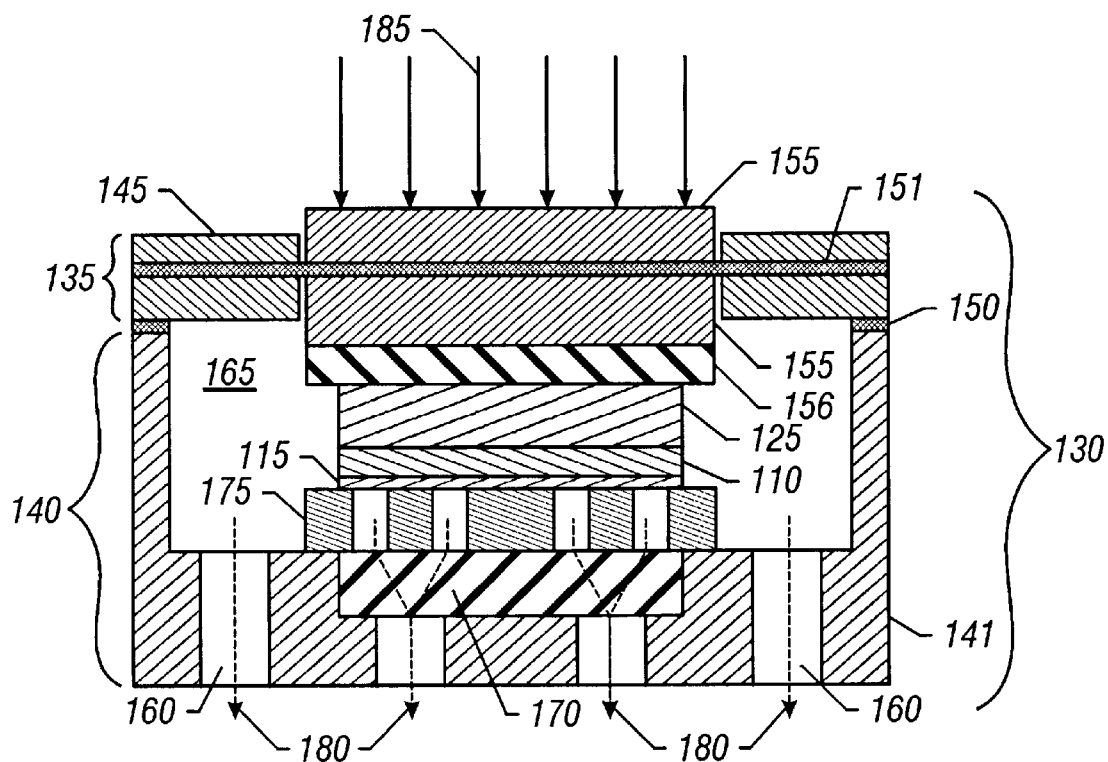
FIG. 4 is a cross-sectional view of the heatspreader and PSA being joined in a vacuum chamber.

The attachment of the PSA 110 to the heatspreader 125 is done inside a vacuum chamber 165, as shown in FIG. 4. In one embodiment, the vacuum chamber assembly 130 is comprised of a top piece or lid assembly 135 and a base assembly 140. FIG. 3 shows the lid assembly 135 comprising an aluminum housing 145 having a central opening with a rubber seal 151 sealingly covering the opening, a rubber gasket 150 mounted around the perimeter of the housing 145 for sealing the lid assembly 135 to the base assembly 140. Blocks of aluminum 155, sized to fit the opening, are positioned above and below the rubber seal 151 and can float freely up and down with the rubber seal 151. The blocks 155 may optionally be attached to the rubber seal 151. Attached to the lower block 155 is a rubber pad 156 that will interface with the heatspreader 125 during assembly.

The base assembly 140 has a cavity or vacuum chamber 165 that the components are assembled in, as shown in FIG. 4. In the preferred embodiment, the base assembly 140 has a base piece 141 made from aluminum that has air evacuation chambers 160 milled into it for evacuating the air from the vacuum chamber 165, and in particular, evacuating air from around and under the PSA 110 and heatspreader 125 during assembly. The method and apparatus for evacuation of air from a closed cavity to create a vacuum is known in the art and will not be described here. A recess is milled near the center of the vacuum chamber 165 for placement of a vacuum pad 170. A pedestal 175 is positioned above the vacuum pad 170 within the vacuum chamber 165. The vacuum pad 170 has openings to allow air to be removed from under the pedestal 175 and also allows the pedestal 175 to move up and down while holding the PSA 110 and heatspreader 125 in a stationary position during assembly.

Referring again to FIG. 4, the lamination process starts with the PSA 110 (without top liner 115) being placed upon the pedestal 175 inside the vacuum chamber 165 of the base assembly 140. The heatspreader 125 is placed on the PSA 110. Optionally, the heatspreader 125 and PSA 110 may be tacked together prior to placement on the pedestal 175. The lid assembly 135 is then put on the base assembly 140 with the rubber pad 156 in contact with the heatspreader 125. Air is then drawn out of the vacuum chamber 165 through the air evacuation chambers 160, as shown by dashed arrows 180, creating a vacuum. The size and shape of the air evacuation chambers along with the vacuum equipment are known in the art and need not be described here. The important aspect of the vacuum equipment is that it is able to fully evacuate the air from the vacuum chamber 165. Once the desired vacuum has been achieved in the vacuum chamber 165, pressure is then applied to the block 155 of the lid assembly 135, as shown by arrows 185. The upper block 155 transfers the pressure force to the lower block 155 inside the vacuum chamber 165 (flexing the rubber seal 151) to the rubber pad 156 and finally to the heatspreader 125. The pressure joins the heatspreader 125 to the PSA 110 in an air free environment, resulting in a void free lamination interface between them. Once the heatspreader 125 and PSA 110 are attached, the vacuum is released and the top 135 removed. The heatspreader 125, having the PSA 110 attached to it, is then removed from the vacuum chamber 165 and is now ready for use.

Figure 5:
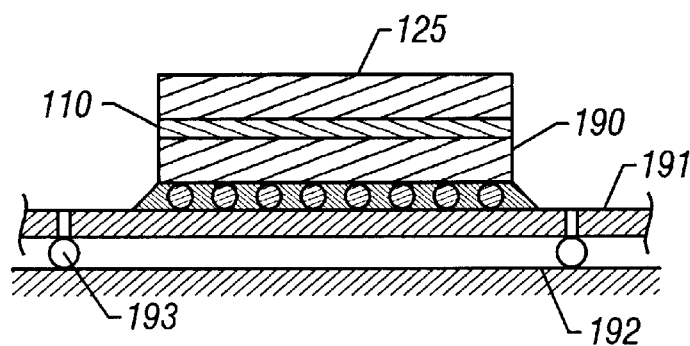
FIG. 5 is a cross-sectional view of the improved heatspreader attached to an integrated circuit die of a semiconductor package.

Prior to the application of the heatspreader 125 to an IC die, the lower release liner 115 is removed and the heatspreader 125 is attached to the integrated circuit package, such as a flip-chip 190, shown in FIG. 5. Optionally this same vacuum lamination process described previously may be used to attach the heatspreader 125 with PSA 110 to the IC die 190 for a void free interface. The flip-chip 190 is attached to a substrate 191 with solder bumps and the substrate 192 is attached to a printed circuit board by solder balls 193 While the invention herein disclosed has been described by means of specific embodiments and applications thereof, numerous modifications and variations could be made thereto by those skilled in the art without departing from the scope of the invention set forth in the claims.

What is claimed is:

1. An enhanced method of applying a pressure sensitive adhesive (PSA) to a heatspreader comprising the steps of:
   (a) providing a pressure sensitive adhesive (PSA) having a top surface and a releasable liner covering a bottom surface;
   (b) providing a heatspreader having an upper surface and a lower surface; and
   (c) attaching the top surface of the PSA to the lower surface of the heatspreader with pressure in an air free environment, the pressure originating from outside of the air free environment.

2. The method of claim 1 wherein the air free environment is a vacuum chamber assembly.

3. The method of claim 1 further comprising the steps of:
   (d) removing the releasable liner on the bottom surface of the PSA; and
   (e) attaching the heatspreader with PSA to an IC die under pressure in an air free environment.

4. The method of claim 3 wherein the air free environment is a vacuum chamber assembly.

5. An enhanced method of applying a pressure sensitive adhesive (PSA) to a heatspreader comprising the steps of:
   (a) providing a pressure sensitive adhesive (PSA) having a top surface and a releasable liner covering a bottom surface;
   (b) providing a heatspreader having an upper surface and a lower surface;
   (c) providing a vacuum chamber assembly with a pedestal;
   (d) positioning the bottom surface of the PSA on the pedestal;
   (e) positioning the lower surface of the heatspreader on the top surface of the PSA;
   (f) closing the vacuum chamber assembly;
   (g) drawing a vacuum to remove air inside the vacuum chamber assembly creating an air free environment;
   (h) applying pressure joining the heatspreader and PSA, the pressure originating from outside of the vacuum chamber assembly;
   (i) releasing the vacuum in the vacuum chamber assembly;
   (j) opening the vacuum chamber assembly; and
   (k) removing the heatspreader with PSA attached from the vacuum chamber assembly.

6. The method of claim 5 further including the step of:
   (l) removing the releasable liner covering the bottom surface of the PSA; and
   (m) attaching the PSA to an integrated circuit die.

7. The method of claim 5 further including the step of:
   (l) removing the releasable liner covering the bottom surface of the PSA; and
   (m) attaching the PSA to an integrated circuit die under pressure in a vacuum chamber assembly.

8. The method of claim 6 wherein the pressure is applied by way of a lid assembly of the air free environment.

9. The method of claim 5 wherein the pressure is applied by way of a lid assembly of the vacuum chamber assembly.

* * * * *